(12) United States Patent
Sukup et al.

(10) Patent No.: US 7,733,155 B2
(45) Date of Patent: Jun. 8, 2010

(54) LOW POWER VOLTAGE DETECTION CIRCUIT AND METHOD THEREFOR

(75) Inventors: Frantisek Sukup, Roznov (CZ); Josef Halamik, Roznov (CZ); Christophe Basso, Pibrac (FR)

(73) Assignee: Semiconductor Components Industries, LLC, Phoenix, AZ (US)

( * ) Notice: Subject to any disclaimer, the term of this patent is extended or adjusted under 35 U.S.C. 154(b) by 392 days.

(21) Appl. No.: 11/815,835

(22) PCT Filed: Jun. 6, 2005

(86) PCT No.: PCT/US2005/019761
§ 371 (c)(1),
(2), (4) Date: Aug. 8, 2007

(87) PCT Pub. No.: WO2006/132629
PCT Pub. Date: Dec. 14, 2006

(65) Prior Publication Data
US 2009/0027087 A1    Jan. 29, 2009

(51) Int. Cl.
*G06G 7/28* (2006.01)
(52) U.S. Cl. .................. 327/334; 327/142; 327/143; 327/198
(58) Field of Classification Search ............. 327/334; 331/143
See application file for complete search history.

(56) References Cited

U.S. PATENT DOCUMENTS 6,633,193 B1 * 10/2003 Halamik et al. ............. 327/334

* cited by examiner

*Primary Examiner*—Lincoln Donovan
*Assistant Examiner*—John W Poos
(74) *Attorney, Agent, or Firm*—Robert F. Hightower

(57) ABSTRACT

In one embodiment, a low power voltage detection circuit includes a first voltage detection device that receives power from an input voltage and a second voltage detection device receives power from an output of the low power voltage detection circuit.

19 Claims, 2 Drawing Sheets

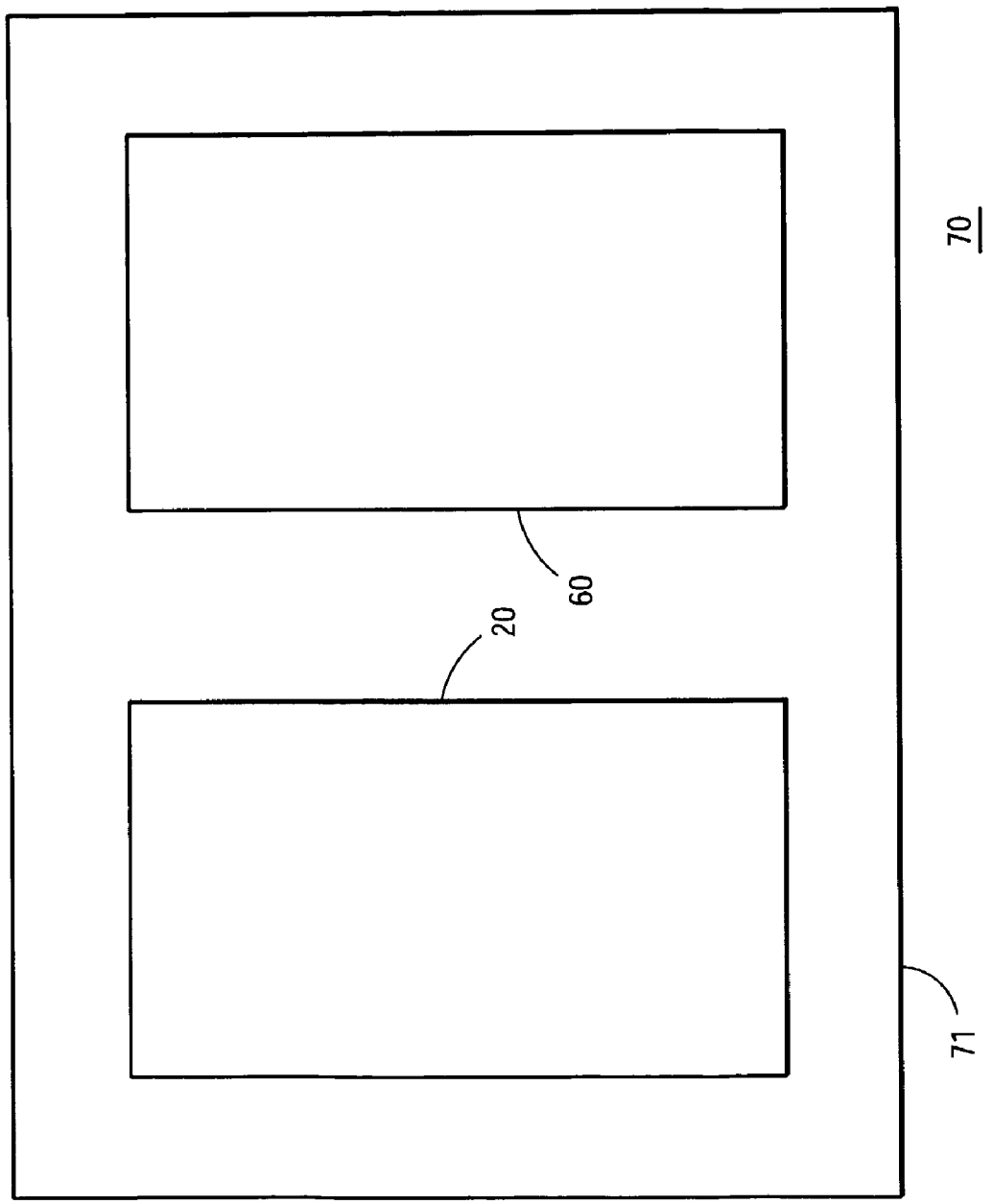

US 7,733,155 B2

LOW POWER VOLTAGE DETECTION CIRCUIT AND METHOD THEREFOR

BACKGROUND OF THE INVENTION

The present invention relates, in general, to electronics, and more particularly, to methods of forming semiconductor devices and structure.

In the past, the semiconductor industry utilized various methods and structures to form voltage detection circuits that would detect the point at which a voltage reached a certain value. One application for such voltage detection circuits was as an under-voltage lock-out (UVLO) circuit for a switching power supply controllers. One example of such a switching power supply controller was the NCP345 that was available from ON semiconductor of Phoenix Ariz. The prior switching power supply controllers typically formed a switching drive signal that was used to switch a power transistor to produce a regulated voltage. In switching power supply controller applications it was important to prevent driving the power switch of the power supply controller if the input voltage was less than a minimum desired operating value. These prior UVLO circuits generally had a power dissipation when the input voltage was below the desired operating value that was approximately equal to the power dissipation when the input voltage was above the desired operating value.

Another type of voltage detection circuit was disclosed in U.S. Pat. No. 6,605,978 issued to Halamik et al on Aug. 12, 2003. This type of voltage detection circuit consumed less power than the prior UVLO circuits, however, this type of circuit generally had less accuracy.

Accordingly, it is desirable to have a voltage detection circuit that has low power dissipation, and that has accurate detection of at least the lower threshold value of the input voltage.

BRIEF DESCRIPTION OF THE DRAWINGS

FIG. 2 illustrates an enlarged plan view of a semiconductor device that includes the voltage detection circuit of FIG. 1 in accordance with the present invention.

Figure 1:
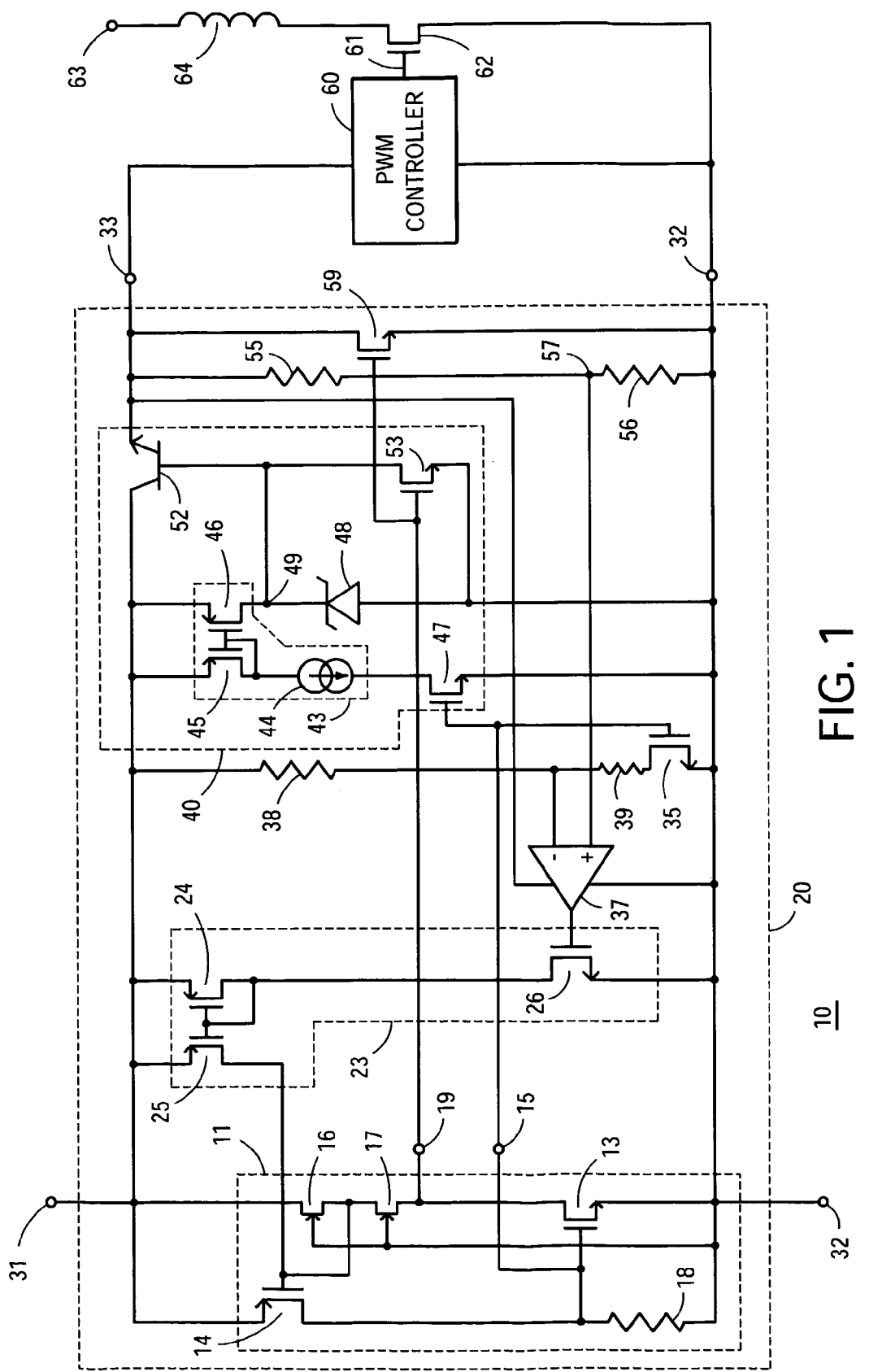
FIG. 1 schematically illustrates an embodiment of a portion of a power supply system having a voltage detection circuit in accordance with the present invention.

For simplicity and clarity of illustration, elements in the figures are not necessarily to scale, and the same reference numbers in different figures denote the same elements. Additionally, descriptions and details of well-known steps and elements are omitted for simplicity of the description. As used herein current carrying electrode means an element of a device that carries current through the device such as a source or a drain of an MOS transistor or an emitter or a collector of a bipolar transistor or a cathode or anode of a diode, and a control electrode means an element of the device that controls current through the device such as a gate of an MOS transistor or a base of a bipolar transistor. Although the devices are explained herein as certain N-channel or P-Channel devices, a person of ordinary skill in the art will appreciate that complementary devices are also possible in accordance with the present invention. It will be appreciated by those skilled in the art that the words during, while, and when as used herein are not exact terms that mean an action takes place instantly upon an initiating action but that there may be some small but reasonable delay between the reaction that is initiated by the initial action.

DETAILED DESCRIPTION OF THE DRAWINGS

FIG. 1 schematically illustrates an embodiment of a portion of a power supply control system 10 that includes a voltage detection circuit 20. Voltage detection circuit 20 is formed to have low power consumption while the input voltage used for operating circuit 20 is less than a desired minimum threshold value or first threshold value. System 10 typically includes a PWM controller 60, a switching power transistor 62, and an energy storage inductor 64. In some embodiments, inductor 64 may be a portion of a transformer. Inductor 64 generally is connected to receive a rectified ac voltage on an input 63. Controller 60 is configured to receive power from circuit 20 and form a switching drive signal on an output 61 that is used to drive transistor 62. Circuit 20, controller 60, and transistor 62 may be formed together on a common semiconductor die while inductor 64 typically is external to the semiconductor die. However, in some embodiments controller 60 or transistor 62 may be external to the semiconductor die on which circuit 20 is formed.

Circuit 20 receives power from an operating voltage or input voltage that is applied between a voltage input terminal or input 31 and a voltage return terminal or return 32 of circuit 20. The input voltage generally is a dc voltage or a rectified ac voltage that may be formed from the rectified ac voltage applied to input 63 or may be derived from another source. Circuit 20 forms an output voltage for powering other circuits, such as controller 60, between an output 33 and return terminal 32. As will be seen further hereinafter, circuit 20 receives the input voltage applied to input 31 and decouples the input voltage from output 33 responsively to the input voltage being less than a first threshold value and couples the input voltage to output 33 responsively to the input voltage being no less than the first threshold value. Thus, prior to the input voltage reaching the first threshold value, controller 60 does not receive power for operating controller 60. Circuit 20 also changes the threshold to a lower value as will be seen further hereinafter. System 10 utilizes the output voltage formed on output 33 to operate controller 60. Additionally, after the input voltage is no less than the first threshold value, circuit 20 applies power to other portions of circuit 20 in order to more accurately detect the input voltage decreasing back to the first threshold value so that circuit 20 may again decouple power from output 33 and controller 60.

Circuit 20 includes a voltage detection circuit 11, a reset circuit 23, an output voltage controller 40, a comparator 37, a reference voltage network that includes a resistor 55 and a resistor 56, and a switched feedback network that includes a resistor 38, a resistor 39, and a feedback decoupling switch or transistor 35. In some embodiments, circuit 20 may also include an optional output disable transistor 59. As will be seen further hereinafter, controller 40 functions as a selectively enableable linear voltage regulator that can be selectively coupled to receive power from the input voltage and form the regulated output voltage on output 33 or can be selectively decoupled from receiving power from the input voltage and inhibited from forming the output voltage. In order to minimize the power dissipation of circuit 20, threshold voltage detection circuit 11 is coupled to continuously receive power from the input voltage applied to input 31, however, power is only applied to comparator 37 and controller 40 after the input voltage has reached a value no less than the first threshold value. Circuit 11 has very low power consumption as described in the '978 patent and typically is much less than the operating current and resulting power consumption of comparator 37, thus, the power consumption of circuit 20 is low when the input voltage is lees than the first threshold value.

Threshold voltage detection circuit 11 includes a threshold transistor 14, a first JFET transistor 16, a second JFET transistor 17, a lower output transistor 13, and a resistor 18. Circuit 11 is similar to and functions similarly to the voltage detection device disclose in U.S. Pat. No. 6,605,978 issued to Halamik et al on Aug. 12, 2003 which is hereby incorporated herein by reference ('978 patent). Transistors 13, 14, 16, and 17 of threshold voltage detection circuit 11 are similar to corresponding transistors 13, 14, 16, and 17 of voltage detection device 10 that is described in the '978 patent and resistor 18 of circuit 11 functions similarly to transistor 18 of the '978 patent. Reset circuit 23 includes a first level shift transistor 26, a second level shift transistor 24, and a reset transistor 25. Transistors 24 and 26 function as a level shifter that shifts the signal of circuit 23 from being referenced to the voltage of output 33 as the output of comparator 37 to being referenced to the voltage of input 31. Output voltage controller 40 includes an enableable linear voltage regulator that includes a pass transistor 52, a regulator disable switch or transistor 53, a switched current source 43, and a reference voltage generator implemented in the illustrated embodiment as a zener diode 48. Switched current source 43 is utilized to couple a bias current to diode 48 and decouple the bias current from diode 48 in order to assist in enabling and disabling the voltage regulator to form the output voltage. Switched current source 43 includes a current source 44, a current mirror that includes current mirror coupled transistors 45 and 46, and a current source switch or transistor 47.

In operation, as the value of the input voltage applied to input 31 begins increasing from a value of approximately zero, circuit 11 receives the input voltage. As long as the value of the input voltage is less than the first threshold value which is substantially the threshold voltage of transistor 14 plus the pinch-off voltage of transistor 16, transistor 14 is disabled and transistor 16 operates in the triode mode. In the triode mode, transistor 16 couple output 19 to receive the input voltage. With transistor 14 disabled, resistor 18 couples the gate of transistors 13, 35, and 47 to return 32 which disables the transistors. Because transistors 16 and 17 are in the triode mode output 19 is coupled to input 31 through transistors 16 and 17, and the value of the input voltage is applied to output 19. Transistors 16 and 17 remain enabled in the triode mode as long as the value of the input voltage is less than the pinch-off voltage of transistor 16 plus the threshold voltage of transistor 14. As the value of the input voltage reaches the pinch-off voltage of transistor 16 plus the threshold voltage of transistor 14, transistor 16 begins operating in the pinch-off mode, thus becomes non-conducting, and the source of transistor 16 along with output 19 are clamped to the pinch-off voltage of transistor 17. Transistor 17 is formed so that the pinch-off voltage is sufficiently large to enable transistors 53 and 59. Since transistor 47 is disabled, there is no current flowing through current source 43, thus, diode 48 does not receive a bias current and the reference voltage is not applied to transistor 52. Since transistor 53 is enabled, the gate of transistor 52 is connected to return 32 thereby disabling transistor 52, decoupling the regulator from receiving the input voltage, and inhibiting circuit 20 from forming the output voltage on output 33. Additionally, optional transistor 59 is enabled and shorts output 33 to return 32 further ensuring that no output voltage is formed on output 33. Since no voltage is applied to output 33, comparator 37 is disabled which also disables transistor 26 and current mirror coupled transistors 24 and 25. Transistor 35 is also disabled therefore no feedback voltage is applied to the inverting input of comparator 37. Since transistor 35 is disabled, resistors 38 and 39 consume negligible power. The only portion of circuit 20 that is consuming power is circuit 11, thus, the power dissipation of circuit 20 is low. Circuit 20 does not yet apply power to controller 60 thereby further reducing power dissipation.

As the value of the input voltage increases and becomes no less than the first threshold value, transistor 14 begins to conduct and supplies a current to resistor 18. The current through resistor 18 enables transistors 13, 35, and 47. Enabling transistor 13 pulls output 19 low which lowers the value of the voltage applied to the gate of transistor 14. Lowering the gate voltage of transistor 14 lowers the threshold value of circuit 11 to a second threshold value that is approximately equal to the threshold voltage of transistor 14 plus the source voltage of transistor 16. Lowering the threshold value of circuit 11 ensures that circuit 11 does not respond to noise as the value of the input voltage continues to increase. Enabling transistor 35 couples resistor 39 to return 32 and forms a feedback signal on the inverting input of comparator 37 that is representative of the value of the input voltage on input 31. Enabling transistor 47 enables current source 44 to supply a current that flows through transistor 45 and forms an approximately equal current flowing through transistor 46. The current from transistor 46 is supplied to diode 48 as a bias current that enables diode 48 to form the reference voltage on node 49. It can be seen that diode 48 and source 43 function to selectively form the reference voltage or selectively inhibit forming the reference voltage responsively to the input voltage being less than the first threshold voltage or being no less than the first threshold voltage, respectively. Disabling transistor 53 decouples the base of transistor 52 from return 32 thereby enabling transistor 52 to receive the input voltage and also allows the bias current through diode 48 to apply the reference voltage to node 49 and the base of transistor 52. Enabling transistor 47 and disabling transistor 53 couples the regulator to receive power from the input voltage and enables the regulator to couple the input voltage from input 31 to output 33 as the output voltage. The output voltage from output 33 is used to supply operational power to comparator 37.

The reference voltage network of resistors 55 and 56 form a reference voltage on a node 57. Those skilled in the art will appreciate that the reference voltage may be formed by a variety of other well-known reference voltage generators. Comparator 37 receives the reference voltage and the feedback voltage and detects the input voltage changing to a value less than a third threshold value. The third threshold value typically is selected to be approximately no greater than the first threshold value. The values of resistors 38, 39, 55, and 56 typically are chosen to ensure that the third threshold value is approximately no greater than the first threshold value. Forming the third threshold value to be no greater than the first threshold value provides circuit 20 with hysteresis. The hysteresis prevents circuit 20 from switching modes if the value of the input voltage decreases just a small amount during the normal operation of controller 60. Comparator 37 is more accurate that circuit 11, thus, comparator 37 can detect the input voltage decreasing to a value that is less than the third threshold voltage value more accurately than circuit 11. Typically comparator 37 is about ten times more accurate than circuit 11. It can be seen that the second threshold voltage of circuit 11 should be chosen to be less than the first and third threshold values to prevent circuit 11 from affecting the operation of comparator 37. Generally, the second threshold value is about sixty percent (60%) less than the first threshold value.

If the input voltage changes to a value less than the third threshold value, the output of comparator 37 goes high and comparator 37 responsively inhibits circuit 20 from forming the output voltage and resets circuit 11 to detect the first threshold value. The high from comparator 37 enables transistor 26 to form a current flow through transistor 24. The current through transistor 24 couples a gate voltage to transistor 25 that also enables transistor 25. Enabling transistor 25 shorts out the gate-to-source voltage of transistor 14 thereby disabling transistor 14. Disabling transistor 14, stops current flow through resistor 18 which again pulls the gate of transistors 13, 35, and 47 to return 32 thereby disabling the transistors. Disabling transistor 13 releases output 19 to be pulled to the pinch-off voltage of transistor 17 thereby resetting circuit 11 to detect the first threshold value and once again enabling transistors 53 and 59. Disabling transistor 47 disables source 43 and inhibits diode 48 from forming the reference voltage, and enabling transistor 53 couples the base of transistor 52 to return 32 thereby disabling transistor 52. Thus, disabling transistor 47 and enabling transistor 53 decouples the regulator from receiving power from the input voltage and disables the regulator from coupling the input voltage from input 31 to output 33. Inhibiting circuit 20 from forming the output voltage disables comparator 37 and the output thereof goes low which disables circuit 23. Thus, circuit 20 is reset back to detect the input voltage changing to the first threshold voltage.

In one embodiment of circuit 20, circuit 20 consumed about one micro-amp of current when the input voltage was less than the first threshold value and about one hundred micro-amps of current when the input voltage was no less than the first threshold value. Accordingly, it can be seen that the power consumption of circuit 20 is very low when the input voltage is less than the first threshold value.

To assist in facilitating this operation of circuit 20, the source of transistor 14 is connected input 31 and a drain of transistor 14 is commonly connected to a first terminal of resistor 18, the gate of transistor 13, a gate of transistor 47, a gate of transistor 35, and output 15. A second terminal of resistor 18 is connected to return 32. A gate the transistor 14 is commonly connected to a source of transistor 16 and a drain of transistor 25. A source of transistor 25 is connected to input 31 and to a source of transistor 24. A gate of transistor 25 is commonly connected to a gate and a drain of transistor 24, and to a drain of transistor 26. A source of transistor 26 is connected to a source of transistor 13. A drain of transistor 13 is commonly connected to a source of transistor 17, to an output 19 of circuit 11, to a gate of transistor 53, and to a gate of transistor 59. A drain of transistor 59 is connected to output 33, and a source of transistor 59 is connected to return 32 and to a first terminal of resistor 56. A second terminal of resistor 56 is commonly connected to node 57, the non-inverting input of comparator 37, and a first terminal of resistor 55. A second terminal of resistor 55 is connected output 33. An inverting input of comparator 37 is commonly connected to a first terminal of resistor 38 and a first terminal of resistor 39. A second terminal of resistor 38 is connected to input 31. The output of comparator 37 is connected to a gate of transistor 26. A power supply input of comparator 37 is connected to output 33 and a power return of comparator 37 is connected to return 32. A second terminal of resistor 39 is connected to a drain of transistor 35 which has a source connected to return 32. A second terminal of resistor 38 is connected to input 31. A source of transistor 47 is connected to return 32 and a drain is connected to a first terminal of current source 44. A second terminal of current source 44 is commonly connected to a drain and a gate of transistor 45, and a gate of transistor 46. A source of transistor 45 is commonly connected to input 31 and a source of transistor 46. A drain of transistor 46 is commonly connected to node 49, a cathode of diode 48, a base of transistor 52, and a drain of transistor 53. A source of transistor 53 is commonly connected to return 32 and an anode of diode 48. A collector of transistor 52 is connected to input 31 and an emitter is connected to output 33. A power supply input of PWM controller 60 is connected to receive power from output 33 and a power return of controller 60 is connected to return 32. PWM drive output 61 of controller 60 is connected to a gate of transistor 62.

FIG. 2 schematically illustrates an enlarged plan view of a portion of an embodiment of a semiconductor device 70 that is formed on a semiconductor die 71. Circuit 20 is formed on die 71. Controller 60 and transistor 62 may also be formed thereon. Die 71 may also include other circuits that are not shown in FIG. 2 for simplicity of the drawing. Circuit 20, controller 60, transistor 62, and device 70 are formed on die 71 by semiconductor manufacturing techniques that are well known to those skilled in the art.

In view of all of the above, it is evident that a novel device and method is disclosed. Included, among other features, is forming first voltage detection device that receives power from an input voltage and a second voltage detection device receives power from an output of the low power voltage detection circuit. Forming the first detection device to have low power dissipation and to have lower power dissipation than the second voltage detection device reduces the power dissipation. Configuring the second voltage detection device to receive power from the output voltage and to selectively form the output voltage further reduces the power dissipation. Coupling other devices, such as a PWM controller, to receive operating power from the output voltage also assists in reducing the power dissipation.

While the invention is described with specific preferred embodiments, it is evident that many alternatives and variations will be apparent to those skilled in the semiconductor arts. For example, the third threshold value can be changed by changing the value of resistors 38 or 39, such as by shorting out one of the resistors.

Additionally, the word "connected" is used throughout for clarity of the description, however, it is intended to have the same meaning as the word "coupled". Accordingly, "connected" should be interpreted as including either a direct connection or an indirect connection.

The invention claimed is:

1. A low power under-voltage detection method comprising:
   coupling a first voltage detection circuit of an under-voltage detection circuit to continuously receive an input voltage, to decouple the input voltage from an output of the under-voltage detection circuit responsively to the input voltage being less than a first value and to couple the input voltage to the output of the under-voltage detection circuit as an output voltage responsively to the input voltage being no less than the first value; and
   coupling a second voltage detection circuit of the under-voltage detection circuit to receive a signal that is representative of the input voltage responsively to coupling the input voltage to the output, and to decouple the input voltage from the output responsively to the input voltage being less than a second value.

2. The method of claim 1 wherein coupling the first voltage detection circuit of the under-voltage detection circuit to continuously receive the input voltage includes enabling a voltage regulator to couple the input voltage to the output and form the output voltage responsively to the first voltage detection circuit detecting that the input voltage is no less than the first value.

3. The method of claim 2 wherein coupling the second voltage detection circuit of the under-voltage detection circuit to receive the signal that is representative of the input voltage responsively to coupling the input voltage to the output includes coupling the output voltage to the second voltage detection circuit.

4. A low power voltage detection circuit comprising:
a first voltage detection circuit coupled to continuously receive power from an input voltage and configured to form an enable signal responsively to a first threshold value of the input voltage;
an output voltage controller coupled to receive the input voltage and form an output voltage on an output of the low power voltage detection circuit responsively to the enable signal; and
a comparator circuit coupled to receive power from the output voltage controller and form a second threshold value, the comparator circuit coupled to disable the output voltage controller responsively to the input voltage being no greater than the second threshold value wherein the second threshold value is less than the first threshold value.

5. The low power voltage detection circuit of claim 4 wherein the first voltage detection circuit requires less operating current than the comparator circuit.

6. The low power voltage detection circuit of claim 4 wherein the output voltage controller is a linear regulator that is configured: to selectively form the output voltage from the input voltage responsively to the first threshold value of the input voltage and is configured to selectively inhibit forming the output voltage from the input voltage responsively to the second threshold value of the input voltage.

7. The low power voltage detection circuit of claim 6 wherein the linear regulator includes a reference generator coupled to selectively form a reference voltage of the linear regulator responsively to the first threshold value of the input voltage.

8. The low power voltage detection circuit of claim 4 wherein the first voltage detection circuit is configured to change the first threshold value to a third threshold value responsively to the first threshold value of the input voltage.

9. The low power voltage detection circuit of claim 8 wherein the comparator circuit is operably coupled to reset the third threshold value of the first voltage detection circuit back to the first threshold value responsively to the input voltage being no greater than the third threshold value.

10. The low power voltage detection circuit of claim 4 further including a PWM controller coupled to receive the output voltage.

11. The low power voltage detection circuit of claim 4 wherein the comparator circuit is coupled to the output of the low power voltage detection circuit to receive operating power from the output voltage.

12. The low power voltage detection circuit of claim 4 wherein the first voltage detection circuit includes:
a first JFET transistor having a drain coupled to receive the input voltage, a gate coupled to a voltage return of the low power voltage detection circuit, and a source;
a second JFET transistor having a drain coupled to receive the source of the first JFET transistor, a gate coupled to the voltage return, and a source;
a first MOS transistor having a drain coupled to the source of the second JFET transistor, a source coupled to the voltage return, and a gate; and
a second MOS transistor having a source coupled to receive the input voltage, a drain coupled to the gate of the first MOS transistor, and a gate coupled to the drain of the first JFET transistor.

13. A method of forming a low power voltage detection circuit comprising:
coupling the low power voltage detection circuit to receive an input voltage and provide an output voltage to power other circuits coupled to an output of the low power voltage detection circuit;
configuring the low power voltage detection circuit to detect the input voltage being less than a first threshold value and responsively inhibit supplying the output voltage; and
configuring the low power voltage detection circuit to detect the input voltage being no less than the first threshold value and responsively supply the output voltage.

14. The method of claim 13 wherein configuring the low power voltage detection circuit to detect the input voltage being less than the first threshold value and responsively inhibit supplying the output voltage includes configuring the low power under voltage detection circuit to inhibit supplying power to a regulator of the low power under voltage detection circuit.

15. The method of claim 14 wherein configuring the low power under voltage detection circuit to detect the input voltage being no less than the first threshold value and responsively supply the output voltage includes configuring the low power under voltage detection circuit to detect the input voltage being no less than the first threshold value and responsively couple power to the regulator.

16. The method of claim 14 wherein configuring the low power under voltage detection circuit to detect the input voltage being no less than the first threshold value and responsively couple power to the regulator includes configuring the low power under voltage detection circuit to selectively couple a reference voltage to the regulator and configuring the regulator to responsively form the output voltage.

17. The method of claim 13 wherein coupling the low power voltage detection circuit to receive the input voltage and provide the output voltage to power other circuits coupled to the output of the low power voltage detection circuit includes coupling a voltage regulator in series between the input voltage and the output to selectively receive power from the input voltage and responsively form the output voltage.

18. The method of claim 13 wherein coupling the low power voltage detection circuit to receive the input voltage and provide the output voltage to power other circuits coupled to the output of the low power voltage detection circuit includes coupling a first voltage detection circuit to receive power from the input voltage and coupling a second voltage detection circuit to receive power from the output voltage.

19. The method of claim 18 wherein coupling the second voltage detection circuit to receive power from the output voltage includes coupling a comparator to receive power from the output voltage.

* * * * *